(12) United States Patent
Ishihara et al.

(10) Patent No.: US 10,401,394 B2
(45) Date of Patent: Sep. 3, 2019

(54) VOLTAGE SENSOR

(71) Applicants: YAZAKI CORPORATION, Tokyo (JP); Toyota School Foundation, Aichi (JP)

(72) Inventors: Hiroki Ishihara, Shizuoka (JP); Makoto Ishii, Shizuoka (JP); Minoru Sasaki, Aichi (JP)

(73) Assignees: YAZAKI CORPORATION, Tokyo (JP); TOYOTA SCHOOL FOUNDATION, Aichi (JP)

( * ) Notice: Subject to any disclaimer, the term of this patent is extended or adjusted under 35 U.S.C. 154(b) by 0 days.

(21) Appl. No.: 15/583,044

(22) Filed: May 1, 2017

(65) Prior Publication Data
US 2017/0322238 A1    Nov. 9, 2017

(30) Foreign Application Priority Data

May 6, 2016  (JP) .................................. 2016-093214

(51) Int. Cl.
*G01R 31/00* (2006.01)
*G01R 15/24* (2006.01)

(52) U.S. Cl.
CPC .................................. *G01R 15/242* (2013.01)

(58) Field of Classification Search
CPC .. G01R 15/242; G01R 27/2605; G01R 29/24; G01G 5/16; G01D 5/24; G01D 5/2417; G01P 15/125; G01C 19/5726; G01C 19/5755

See application file for complete search history.

(56) References Cited

U.S. PATENT DOCUMENTS

| 6,964,195 | B2 * | 11/2005 | Hobbs ................ | G01C 19/5719 73/504.12 |
| 2005/0284222 | A1 * | 12/2005 | Johnson ............. | G01C 19/5719 73/504.02 |
| 2006/0053885 | A1 * | 3/2006 | Park ....................... | G01C 19/56 73/504.16 |
| 2011/0226058 | A1 * | 9/2011 | Yoneda ............... | G01C 19/5755 73/504.12 |
| 2013/0009716 | A1 * | 1/2013 | Phan Le .............. | H03H 9/2431 331/154 |

(Continued)

FOREIGN PATENT DOCUMENTS

| JP | 3-146875 A | 6/1991 |
| JP | 2013-228367 A | 11/2013 |
| WO | 2015/060071 A1 | 4/2015 |

OTHER PUBLICATIONS

German Office Action for the related German Patent Application No. 102017207333.0 dated Nov. 30, 2018.

*Primary Examiner* — Thang X Le
(74) *Attorney, Agent, or Firm* — Kenealy Vaidya LLP (57) ABSTRACT

A voltage sensor includes an oscillator that has a circular or roughly circular shape and is supported by a mechanical support member, a fixed electrode that has a predetermined gap between the oscillator and the fixed electrode, and a drive electrode that is placed at a position different from the fixed electrode across the oscillator, and to which an AC drive voltage is applied to make the oscillator oscillate. In the voltage sensor, an electrostatic attractive force acts on the oscillator by applying a voltage to the fixed electrode, and a resonance frequency of the oscillator changes.

8 Claims, 8 Drawing Sheets

(56) References Cited

U.S. PATENT DOCUMENTS

2013/0298670 A1* 11/2013 Tsugai .................. G01C 19/56
                                                    73/504.12
2016/0282209 A1*  9/2016 Fujita ................... G01L 9/0016
2016/0298966 A1* 10/2016 Ikehashi ............ G01C 19/5726

* cited by examiner

VOLTAGE SENSOR

CROSS REFERENCE TO RELATED APPLICATION

This application is based on Japanese Patent Application No. 2016-093214 filed on May 6, 2016, the contents of which are incorporated herein by reference.

BACKGROUND

1. Technical Field

The present invention relates to a voltage sensor.

2. Background Art

Traditionally, a voltage sensor that includes a Pockels element, a quarter wave plate, a polarizer, an analyzer and the like is proposed. With this voltage sensor, an optical signal output from a source of light is polarized by the polarizer, and incident on the Pockels element, and an optical modulation that responds to the size of a voltage is received with the Pockels element. The optical signal that receives optical modulation is transmitted to the analyzer through the quarter wave plate. The optical signal output by the analyzer is received and detected by a predetermined optical receiver, and the voltage applied to the Pockels element can be measured (for example, refer to JP-A-H3-146875).

However, the voltage sensor described in JP-A-H3-146875 uses the Pockels element, the quarter wave plate, the polarizer, the analyzer etc. and the number of parts is larger. Further, alignment of the optical axis is necessary. As a result, assembling is complicated.

Thus, a voltage sensor is proposed which includes an oscillator supported by a mechanical suspension and fixed electrodes which are placed opposite to each other through gaps in this oscillator, and by applying a voltage to be measured to the fixed electrodes, to make an electrostatic attractive force act on the oscillator, to change the resonance frequency of the oscillator, the voltage to be measured is calculated (refer to JP-A-2013-228367).

For the voltage sensor, when the voltage to be measured is applied to the fixed electrodes, by the electrostatic attractive force due to this voltage, a spring constant of the suspension will change substantially, and the resonance frequency of the oscillator will change. Because this change has a constant relation with the size of the voltage to be measured, the value of the voltage to be measured can be measured from the changed resonance frequency.

The complicatedness of the assembling can be prevented in the voltage sensor described in JP-A-2013-228367 as the optical parts are not necessary, the increase of the part number is controlled, and the alignment of the optical axis is not necessary.

However, for the voltage sensor described in JP-A-2013-228367, because a signal Q factor (quality factor) obtained by optical measurement and a signal change obtained by electrical measurement are not big, a room for improvement in voltage measurement precision is yet left.

The present invention is accomplished to solve the conventional problem, and the object of the present invention is to provide a voltage sensor so that while the increase of the part number and the complicatedness of the assembling are prevented, the Q factor (quality factor) obtained by the optical measurement and the signal change obtained by the electrical measurement are raised, and improvement of the voltage measurement precision becomes possible.

SUMMARY (1) According to an aspect of the invention, a voltage sensor includes an oscillator that has a circular or roughly circular shape and is supported by a mechanical support member, a fixed electrode that has a predetermined gap between the oscillator and the fixed electrode, and a drive electrode that is placed at a position different from the fixed electrode across the oscillator, and to which an AC drive voltage is applied to make the oscillator oscillate. In the voltage sensor, an electrostatic attractive force acts on the oscillator by applying a voltage to the fixed electrode, and a resonance frequency of the oscillator changes.

According to the voltage sensor (1) of the present invention, because the fixed electrodes are provided against the circular or roughly circular oscillator, and at positions different from the fixed electrodes, the drive electrodes to which AC drive voltages are applied are included, the circular or roughly circular oscillator oscillates to be crushed or pushed out by the drive electrodes, and the amplitude can be lowered as compared to the equally-advancing oscillator. Thus, because the influence of gas damping can be reduced, and the oscillator works stably, a noise is controlled and the signal Q factor (optical measurement) at the time of the resonance and the signal change (electrical measurement) can be raised. Because the parts such as the Pockels element, the quarter wave plate, the polarizer, the analyzer and the like are not necessary, and the alignment of the optical axis is not necessary either, the increase of the part number and complicatedness of the assembling can be prevented. Therefore, while the increase of the part number and the complicatedness of the assembling are prevented, the signal Q factor obtained by the optical measurement and the signal change obtained by the electrical measurement are raised and the voltage measurement precision can be improved.

(2) In the voltage sensor of (1), the support member is connected to at least one of four knobs where an oscillating amplitude is minimized among the oscillator.

According to this voltage sensor (2), because the support member is connected to at least one of the four knobs where the oscillating amplitude is minimized among the oscillator, an energy loss of the oscillation can be lower than a case of connecting to other points.

(3) In the voltage sensor (1) or (2), the fixed electrode is formed with comb-like grooves along the oscillation direction of the oscillator.

According to this voltage sensor, because the fixed electrodes are formed with the comb-like grooves along the oscillation direction of the oscillator, gas escapes in parallel with the vibration, and the influence of gas damping can be controlled further.

(4) In any one of the voltage sensors (4) to (3), the fixed electrode and the drive electrode are formed on a substrate and the oscillator is disposed immediately above the substrate, and the substrate is provided with an opening in an area where the oscillator is formed in a top view.

According to this voltage sensor (4), because the substrate is provided with the opening in a top view in the area where the oscillator, the fixed electrodes and the drive electrodes are formed, gas may escape at the time of oscillation from the opening of the substrate, and the influence of gas damping can be controlled further.

In any one of the voltage sensors (1) to (4), the fixed electrode includes a first fixed electrode and a second fixed electrode, the drive electrode includes a first drive electrode and a second drive electrode, the first and second driving electrodes are disposed at positions opposite to each other relative to the center of the oscillator, AC voltages with the same phase are applied to the first and second drive electrodes, and a virtual line passing through the first and second fixed electrode is perpendicular to a virtual line passing through the first and second drive electrodes.

According to this voltage sensor, because the two drive electrodes are placed at the positions opposite to each other relative to the center of the oscillator, and AC voltages of the same phase are applied, the circular or roughly circular oscillator can oscillate efficiently to be crushed or pushed out. Furthermore, because the two fixed electrodes are placed at the positions perpendicular to the direction linking the two drive electrodes, by placing the two fixed electrodes to face parts of the oscillator where oscillation amount is the biggest, when the voltage to be measured is applied to the two fixed electrodes, the change of the resonance frequency of the oscillator can be more remarkable, and the measurement accuracy can be proved.

According to the present invention, a voltage sensor can be provided so that improvement of the voltage measurement precision becomes possible since the Q factor (quality factor) obtained by the optical measurement and the signal change obtained by the electrical measurement are raised.

DETAILED DESCRIPTION OF THE EMBODIMENTS

A preferred embodiment of the present invention is described based on the figures as follows, but the present invention is not limited to the following embodiment.

Figure 1:
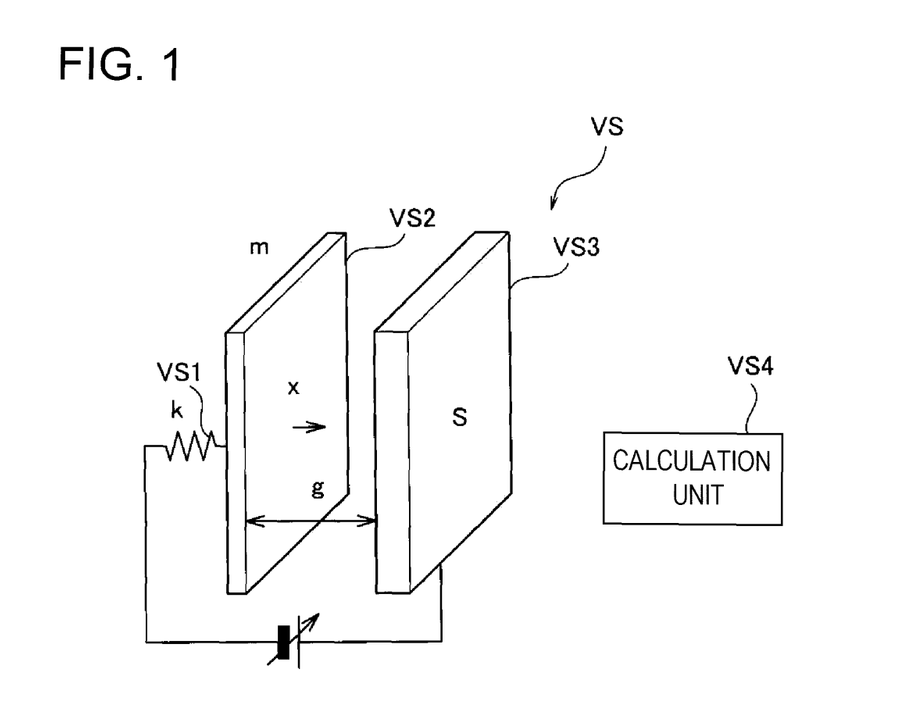
FIG. 1 is a basic configuration diagram indicating the principle of a voltage sensor according to an embodiment of the present invention.

FIG. 1 is a basic configuration diagram indicating the principle of a voltage sensor according to an embodiment of the present invention. As shown in FIG. 1, a voltage sensor VS according to the basic principle includes a mechanical suspension VS1, an oscillator VS2, a fixed electrode VS3, and a calculation unit VS4.

The suspension VS1 supports the oscillator VS2. A spring constant of this suspension VS1 is assumed as k. The oscillator VS2 is a plate electrode supported by the suspension VS1, and the oscillator VS2 is oscillateable due to elasticity of the suspension VS1. The mass of this oscillator VS2 is assumed as m.

The fixed electrode VS3 is a plate electrode which is placed to be opposed to the oscillator VS2 with a gap, and has the relation of parallel plate electrodes with the oscillator VS2. The area in which the oscillator VS2 and the fixed electrode VS3 face each other is assumed as S. The initial gap between the oscillator VS2 and the fixed electrode VS3 is assumed as g.

When an AC voltage is applied to the oscillator VS2 in such a voltage sensor VS, the oscillator VS2 oscillates in a direction (left/right direction in the figure) in which the distance from the fixed electrode VS3 increases and decreases by elasticity of the suspension VS1. This time, the oscillator VS2 oscillates with a resonance frequency fr based on a relation expression (1).

[EQUATION 1]

$$f_r = \frac{1}{2\pi}\sqrt{\frac{k}{m}} \qquad (1)$$

Furthermore, it is assumed that a voltage to be measured is applied to the fixed electrode VS3. At this time, electrostatic attractive force is given from the fixed electrode VS3 to the oscillator VS2, and the distance x is changed. The electrostatic attractive force can be expressed as an equivalent spring constant ke shown in the formula (2).

[EQUATION 2]

$$k_e = \frac{\varepsilon_0 S V^2}{(g-x)^3} \qquad (2)$$

In the formula (2), ε0 is a dielectric constant of the gap g, and V is the voltage to be measured.

Thereby, the oscillator VS2 will oscillate in the resonance frequency fr' shown in the formula (3).

[EQUATION 3]

$$f_r' = \frac{1}{2\pi}\sqrt{\frac{k-k_e}{m}} \qquad (3)$$

Because the equivalent spring constant ke of the formula (2) changes depending on the size of the voltage V applied to the fixed electrode VS3, the resonance frequency fr' shown in the formula (3) reflects the size of the voltage V.

Thus, the calculation unit VS4 can calculate the voltage to be measured from the resonance frequency fr' of the oscillator VS2.

The voltage sensor according to the present embodiment measures the voltage to be measured by using the change of the resonance frequency by the electrostatic attractive force as described above. Because the voltage sensor VS shown in FIG. 1 includes the equally-advancing oscillator VS2 which oscillates in a direction perpendicular to the plate surface of the oscillator VS2, damping (oscillation damps) by neighboring gas becomes easy. Thereby, the signal Q factor (quality factor) obtained by optical measurement and the signal change obtained by electrical measurement is not big, and there is a room for improvement in terms of voltage measurement precision.

Figure 2:
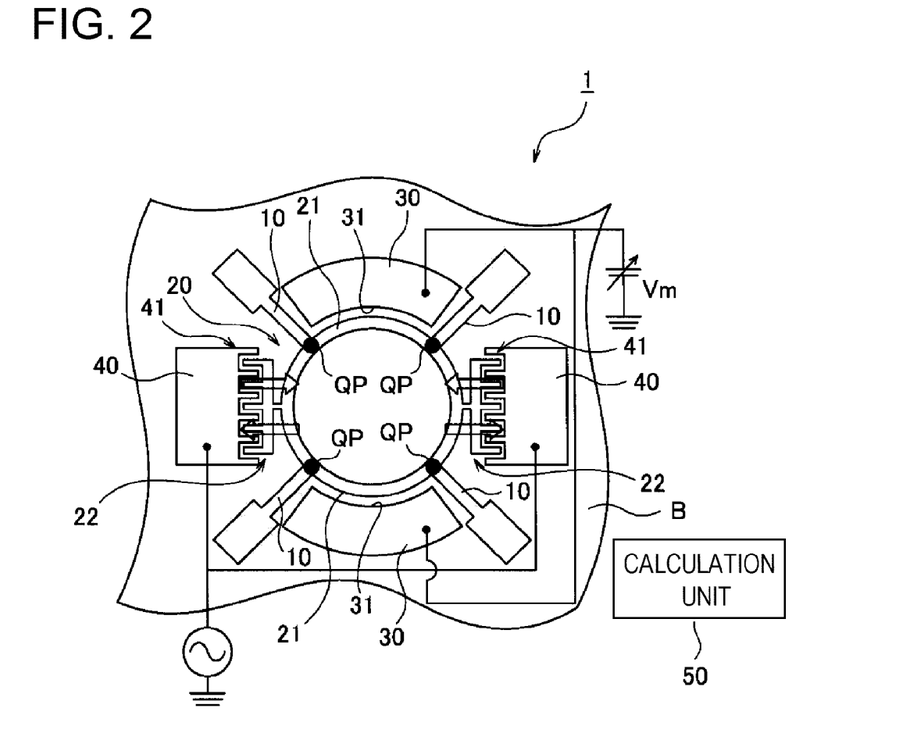
FIG. 2 is a schematic configuration diagram indicating the voltage sensor according to the present embodiment.

FIG. 2 is a schematic configuration diagram indicating a voltage sensor 1 according to the present embodiment. As shown in FIG. 2, the voltage sensor 1 is a microvoltage sensor made by using MEMS (Micro Electro Mechanical Systems) processing technique, and includes support member 10, an oscillator 20, two fixed electrodes 30, and two drive electrodes 40, against a substrate B. Furthermore, the voltage sensor 1 includes a calculation unit 50.

The support member 10 support the oscillator 20. The oscillator 20 is a circular (for example, a perfect circle or an oval) or a roughly circular (for example, a polygon close to a perfect circle or an oval) member, and becomes floated when supported by the support member 10. In the following description, the oscillator 20 is described as a circular (perfect circle) one. The two fixed electrodes 30 are measured electrodes to which the voltage to be measured is applied. These fixed electrodes 30 are placed to sandwich the circular oscillator 20. The fixed electrode 30 has an arc shape to match the external shape of the circular oscillator 20, and has an arc inner portion 31 which is placed to face the oscillator 20 with a predetermined gap.

The two drive electrodes 40 are placed at positions different from the two fixed electrodes 30 to sandwich the circular oscillator 20. AC drive voltages of the same phase are applied to the two drive electrodes 40 to make the oscillator 20 oscillate. More specifically, the two drive electrodes 40 are respectively placed in a direction perpendicular to the direction of linking the two fixed electrodes 30 in a top view (that is, as viewed from a top surface shown in FIG. 2). The oscillator 20 includes a circular ring member 21, and two comb parts 22 which project laterally (the direction the two drive electrodes 40 are placed) from the ring member 21. The two drive electrodes 40 include two comb parts 41 of a comb shape to match the teeth of the two comb parts 22, and are adapted to make the oscillator 20 oscillate effectively. The comb parts 22 and the drive electrodes 40 in the example shown in FIG. 2 are provided at the outer side of the ring member 21, but the present invention is not limited to this, and the comb parts 22 and the drive electrodes 40 may be provided at the inner side of the ring member 21.

Figure 3:
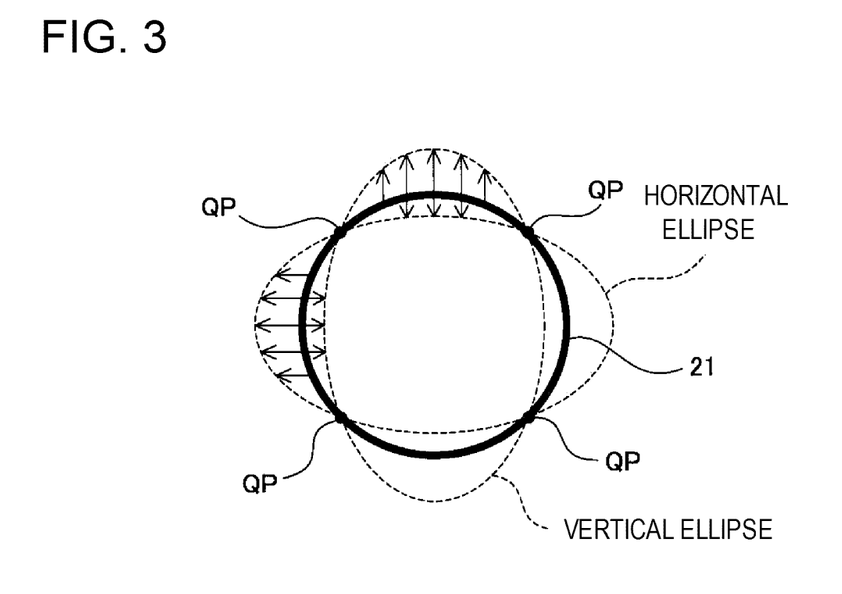
FIG. 3 is a concept diagram indicating the oscillation of a ring member shown in FIG. 2.

FIG. 3 is a concept diagram indicating the oscillation of the ring member 21 shown in FIG. 2. As shown in FIG. 3, when AC voltages of the same phase are applied to the two drive electrodes, a force acts to contract the ring member 21 in the inward direction of the circle, on a straight line linking the two drive electrodes 40, then a force acts to expand the ring member 21 in the outward direction of the circle, and these actions are repeated. As shown in FIG. 3, when the force acts in the inward direction of the circle, the ring member 21 becomes a vertical ellipse, and when the force acts in the outward direction of the circle, the ring member 21 becomes a horizontal ellipse. In this way the ring member 21 will oscillate in a wine-glass mode of repeating the vertical ellipse shape and the horizontal ellipse shape alternately. Because the ring member 21 is circular, and the stiffness of the ring member 21 is high, the shape change amount of the ring member 21 by the oscillation is around 1 nm. The oscillation of the ring member 21 is smaller than the oscillation of the equally advancing oscillator described in JP-A-2018-228367 in which a displacement amount is 3 µm.

Furthermore, the support member 10 in the present embodiment are four ones, and the four support member 10 are connected to four knobs QP where the oscillating amplitude is minimized among the oscillator 20. Therefore, the four support member 10 is adapted not to obstruct the oscillation of the circular oscillator 20. The support member 10 may be one, two or three ones besides four ones if the oscillator 20 can be supported.

Here, a resonance frequency f0 of the oscillator 20 becomes the following formula (4).

$$f_0 = \frac{i(i^2-1)}{2\pi R^2 (i+1)^{1/2}} \left(\frac{EI}{m}\right)^{\frac{1}{2}} \quad (4)$$

Here, i is a parameter decided by oscillation mode (for the wineglass mode resonance, i=2), R is the radius of the ring member 21, E is a Young's modulus, and I is a second section moment obtained as follow.

$$I = \frac{w^3 h}{12} \quad (5)$$

Further, m is a mass of per unit length of the ring circumference, and h is a ring height, and w is a ring width.

Figure 4:
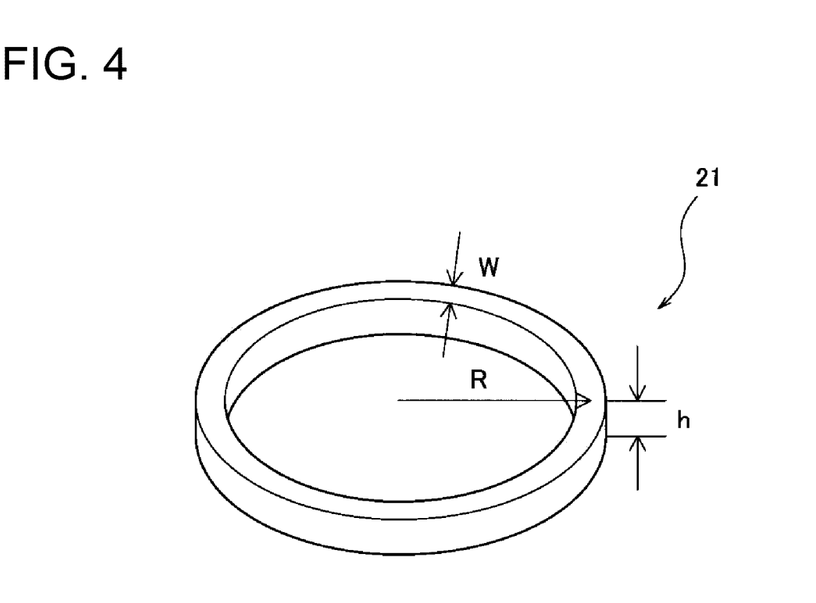
FIG. 4 is a perspective diagram indicating the ring member.

FIG. 4 is a perspective diagram indicating the ring member 21. As shown in FIG. 4, specifically, w shows the radial thickness of the ring member 21, h shows a length perpendicular to a plane including the radial direction, and R indicating the radius of the ring member 21 shows a distance from the center point of the ring member 21 to the width center of the ring member 21.

Like the example described with reference to FIG. 1, when voltage Vm to be measured is applied to the two fixed electrodes 30, the resonance frequency f0 as described above changes according to the size of this voltage Vm. The calculation unit 50 will obtain the voltage Vm to be measured from this change by calculation.

In the present embodiment, any one of the electrodes formed at the root side (the side opposite to the connection side of the oscillator 20) of the four support member 10 becomes an electrode used for electrical measurement.

Figure 5:
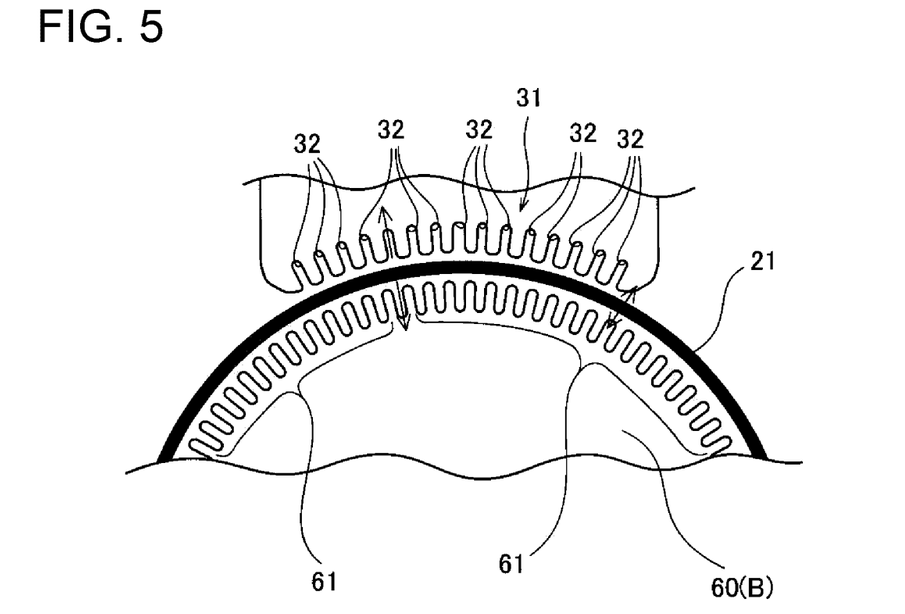
FIG. 5 is a partly enlarged of the voltage sensor according to the present embodiment.
Figure 6:
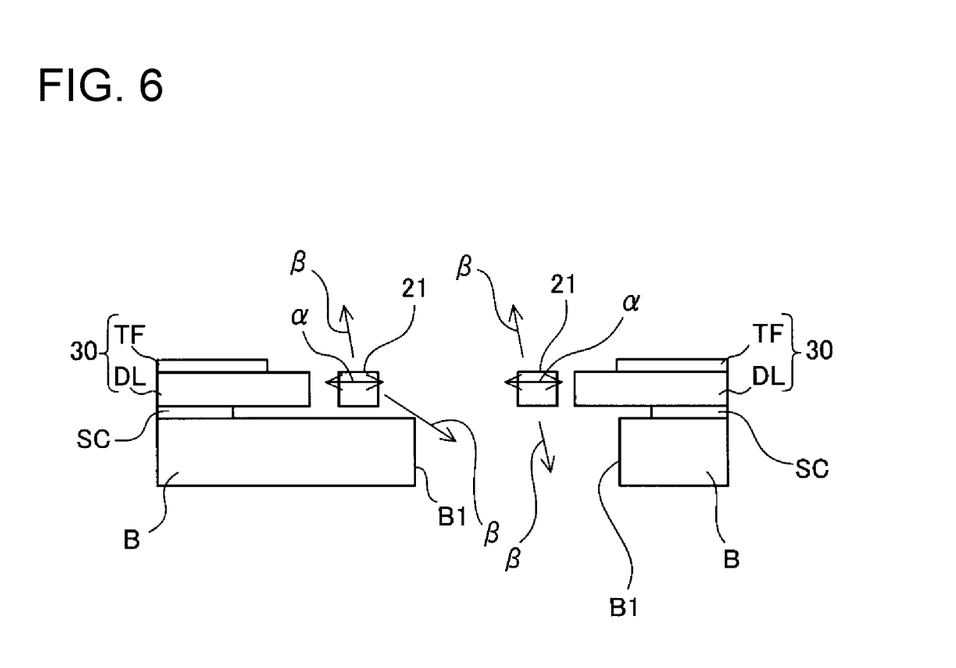
FIG. 6 is a sectional view of the voltage sensor according to the present embodiment.

FIG. 5 is a partly enlarged view of the voltage sensor 1 according to the present embodiment, and FIG. 6 is a sectional view of the voltage sensor 1 according to the present embodiment. As shown in FIG. 5, the two fixed electrodes 30 are formed with comb-like grooves 32 at the arc inner portions 31 along the oscillation direction of the oscillator 20. Thereby, at the time of oscillation, gas falls out through the comb-like grooves 32 (falls out in the same direction as the oscillation direction (the arrow direction shown in FIG. 5)), and damping resistance will be reduced.

As shown in FIG. 5, when a circular structure 60 (for example, a part of the substrate B) is included at the inner side of the ring member 21, this structure 60 may also be formed with comb-like grooves 61 which extend in the ring radial direction across the circumference.

As shown in FIG. 6, the substrate B is provided with an opening B1 at a place (that is, the lower side) corresponding to an area where the oscillator 20 is formed in a top view. Therefore, gas falls out at the time of oscillation through the opening B1 (falls out in a direction (code β shown in FIG. 6) perpendicular to the oscillation direction (code α shown in FIG. 6)), and dumping resistance will decrease.

The substrate B described above means a so-called handle layer. As shown in FIG. 6, a sacrifice layer SC is provided on a handle layer, a device layer DL is provided on the sacrifice layer SC, a film (metal layer) TF is provided on the device layer DL, and the electrodes of the fixed electrodes 30 and the like will be formed by this film TF and the device layer DL.

In such a voltage sensor 1, AC drive voltages of the same phase are applied to the two drive electrodes 40. Because the voltages are AC ones, the oscillator 20 will oscillate as shown in FIG. 3 at the predetermined resonance frequency f0.

At this time, the voltage Vm to be measured is applied to the two fixed electrodes 30. An electrostatic attractive force occurs by this voltage Vm, and the oscillator 20 will oscillate with the resonance frequency f0'.

The calculation unit 50 calculates the size of the voltage Vm to be measured from the changed resonance frequency f0'. The calculation unit 50 stores related data indicating the correlation of the resonance frequency f0' and the size of the voltage Vm to be measured, and will calculate the voltage V to be measured based on the stored related data. At this time, it is necessary for the calculation unit 50 to measure the displacement amount (deforming amount) of the oscillator 20 to measure the resonance frequency f0'. In this case, the voltage sensor 1 irradiates a laser beam to the oscillator 20, and obtains the displacement amount of the oscillator 20 from reflected light (optical measurement). The voltage sensor 1 may measure the displacement amount of the oscillator 20 from a change of capacitance (electrical measurement). When the displacement amount is obtained from the capacitance, the fixed electrodes 30 may be used as they are, or an electrode for separately measuring the displacement amount may be provided.

Then, a laboratory result of the voltage sensor 1 according to the present embodiment is described. The graph shown below shows an analysis result with a frequency property analyzer.

Figure 7:
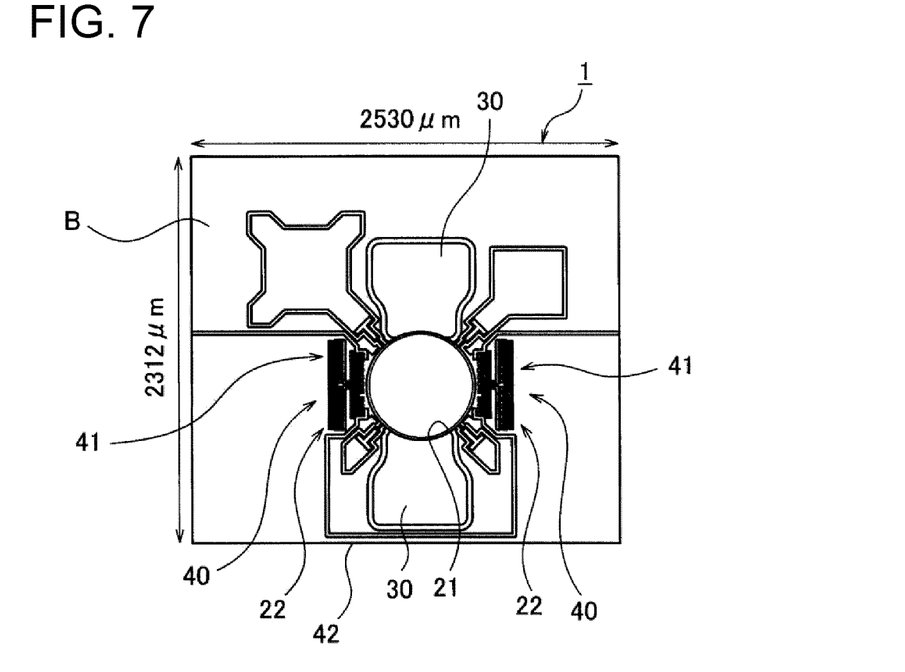
FIG. 7 is a top view indicating the whole of the voltage sensor used by an experiment.
Figure 8:
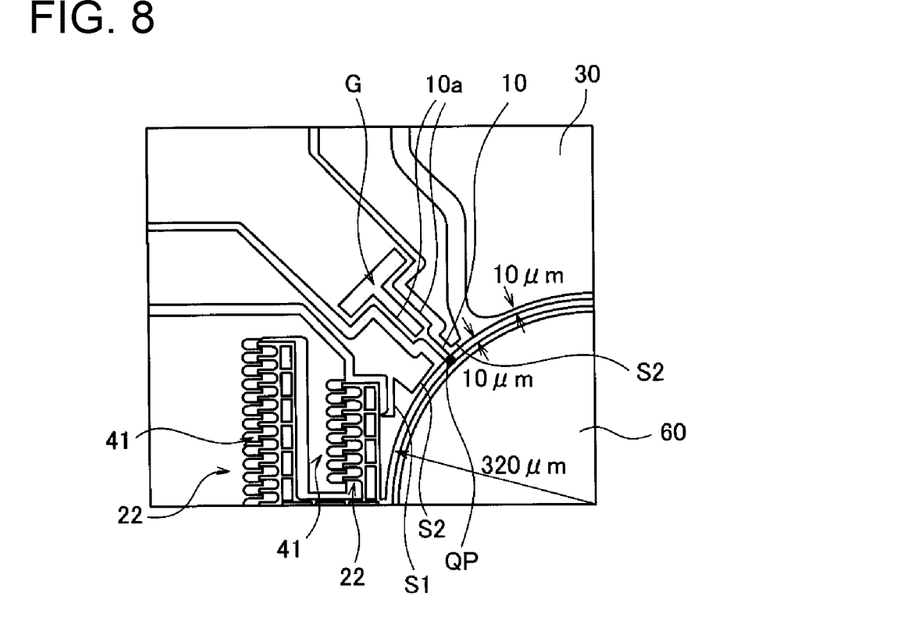
FIG. 8 is a partly enlarged view of the voltage sensor shown FIG. 7.

FIG. 7 is a top view indicating the whole of the voltage sensor 1 used by an experiment, and FIG. 8 is a partly enlarged view of the voltage sensor 1 shown in FIG. 7. In FIG. 7, codes of a part of the parts similar to those in FIG. 2 are omitted.

First, the voltage sensor 1 as shown in FIGS. 7 and 8 is made by using an MEMS technique. The size of the voltage sensor 1 (substrate B) is 2,312*2,530 μm, and the radius R of the ring member 21 is 320 μm. A width w of the ring member 21 is 10 μm. Furthermore, while a voltage is not applied to both the two fixed electrodes 30 and the two drive electrodes 40, the gap between the ring member 21 and the two fixed electrode 30 is 10 μm.

The voltage sensor 1 shown in FIG. 7 has a connecting part 42 to connect the two drive electrodes 40, and the two drive electrodes 40 become one member substantially. Furthermore, as shown in FIG. 8, the support member 10 become elastic structures. That is, the support member 10 have two support parts 10a which are connected to the knobs QP of the ring member 21, and extend and branch off in the root direction from the knobs QP. The support member 10 have elastic structures that have a T-shaped cavity G where a T-shaped vertical bar portion is placed between the two supporting parts 10a.

The oscillator 20 oscillates when AC voltages are applied to the two drive electrodes 40 of the voltage sensor 1. At this time, a signal change issued from the oscillator 20 is detected by electrical measurement, and the resonance frequency is obtained by changing frequency. The measurement of the resonance frequency is performed while the voltage Vm applied to the two fixed electrodes 30 is changed from 0 to 350V.

As shown in FIGS. 7 and 8, the oscillator 20 has a structure to include the two comb parts 22, and the two drive electrodes 40 have shapes to include the two comb parts 41 to cope with these comb parts 22.

Figure 9:
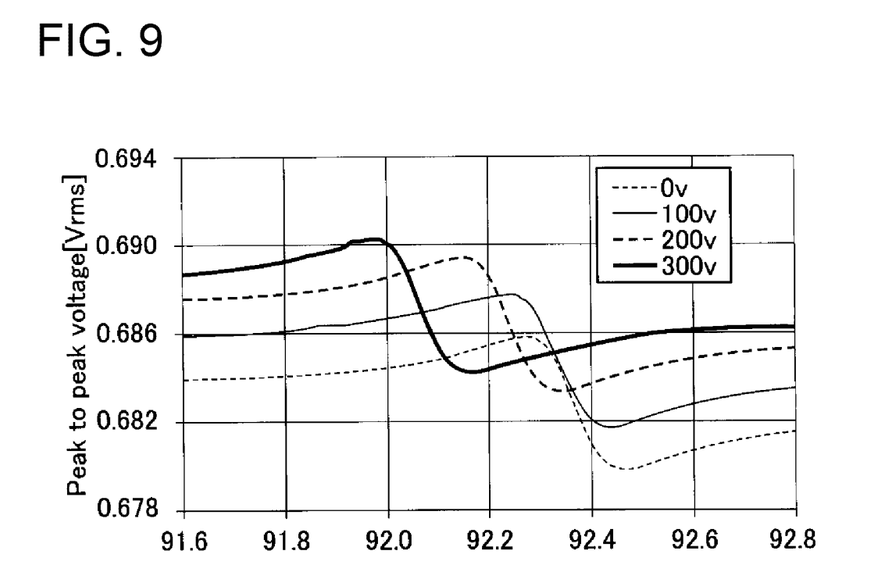
FIG. 9 is a graph indicating a signal change for the frequency of the voltage sensor shown in FIGS. 7 and 8, and shows a signal change when a voltage Vm applied to fixed electrodes is 0V, 100V, 200V and 300V.

FIG. 9 is a graph indicating the signal change for the frequency of the voltage sensor 1 shown in FIGS. 7 and 8, and shows a signal change when the voltage Vm applied to the fixed electrodes 30 is 0V, 100V 200V and 300V.

As shown in FIG. 9, the resonance frequency becomes the highest when the voltage Vm applied to the two fixed electrodes 30 is 0V, and as the applied voltage Vm becomes higher, that is, 100V, 200V and 300V the resonance frequency decreases.

Figure 10:
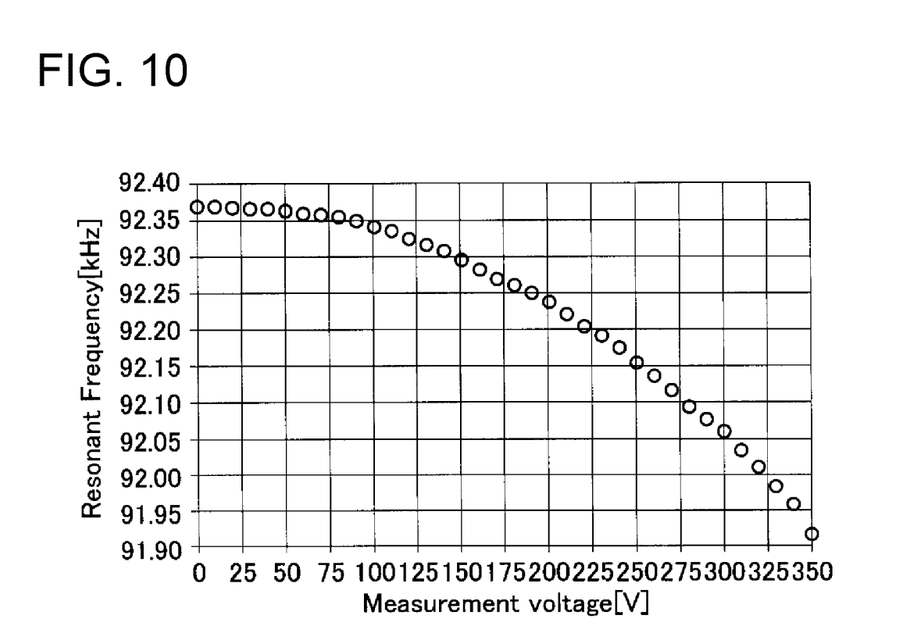
FIG. 10 is a graph indicating the correlation of the voltage Vm applied to the two fixed electrodes of the voltage sensor shown in FIGS. 7 and 8 and resonance frequency.

FIG. 10 is a graph indicating the correlation of the voltage Vm applied to the two fixed electrodes 30 of the voltage sensor 1 shown in FIGS. 7 and 8 and the resonance frequency. As shown in FIG. 10, for the voltage Vm to be measured applied to the two fixed electrodes 30, the resonance frequency decreased monotonically, and this explains how the voltage sensor 1 functions.

Figure 11:
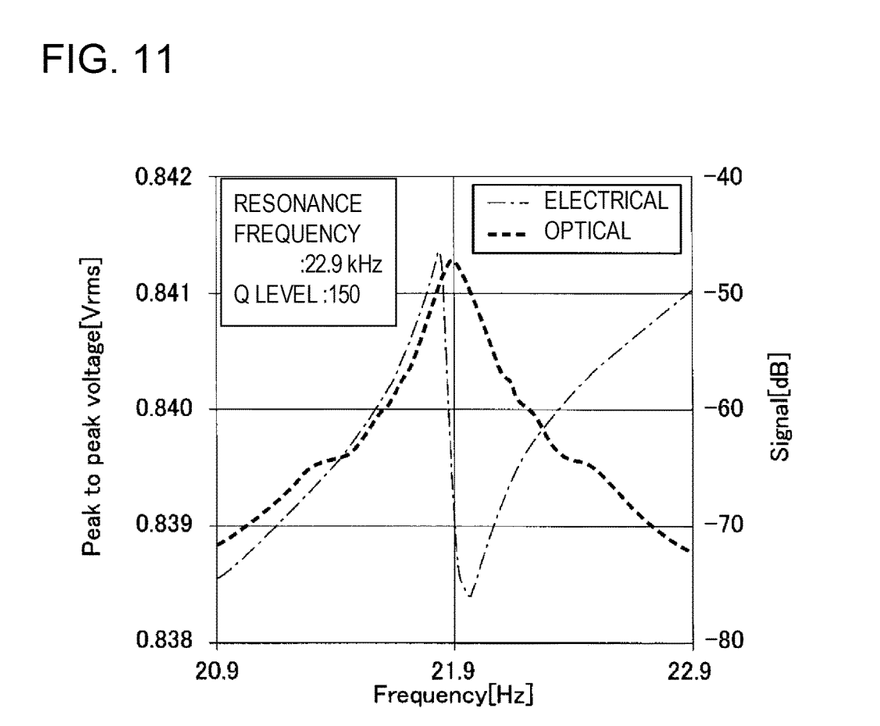
FIG. 11 is a graph indicating the result of optical and electrical measurements of a voltage sensor according to a comparative example.
Figure 12:
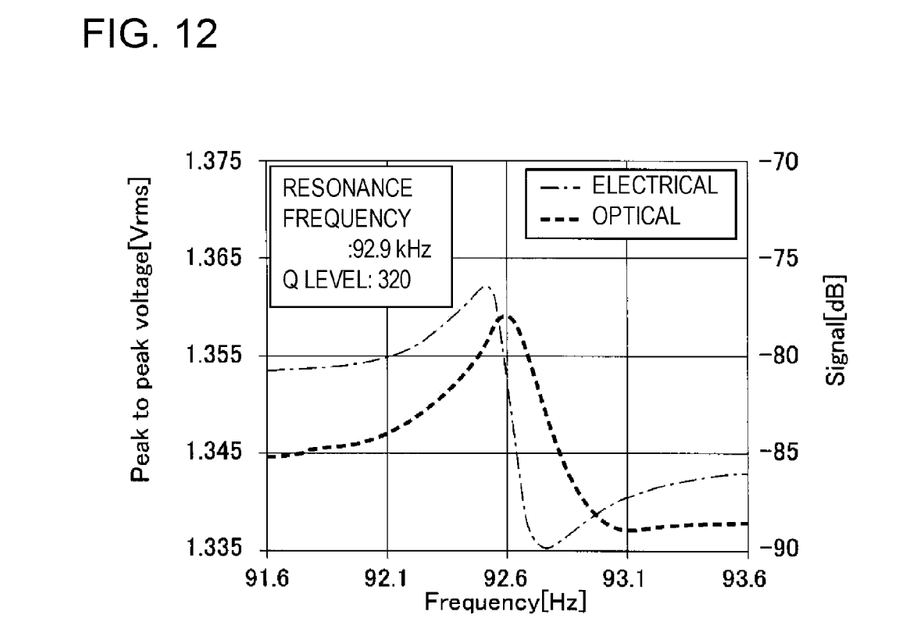
FIG. 12 is a graph indicating the result of optical and electrical measurements of the voltage sensor 1 shown in FIGS. 7 and 8.

FIG. 11 is a graph indicating the result of optical and electrical measurements of a voltage sensor according to a comparative example, and FIG. 12 is a graph indicating the result of optical and electrical measurements of the voltage sensor 1 shown in FIGS. 7 and 8.

As shown in FIG. 11, for the voltage sensor (shown in JP-A-2013-228367) according to the comparative example, the signal change amount in the electrical measurement, becomes approximately 0.0029 [Vrms], and the signal Q factor (quality factor) in the optical measurement becomes 150. In contrast, as shown in FIG. 12, for the voltage sensor 1 shown in FIGS. 7 and 8, the signal change amount in the electrical measurement becomes approximately 0.027 [Vrms], approximately 10 times as compared to before. Furthermore, for the voltage sensor 1 shown in FIGS. 7 and 8, the signal Q factor (quality factor) in the optical measurement becomes 320, approximately 2 times as compared to before. Thus, it may be said that the voltage measurement precision according to the present embodiment can be improved.

Furthermore, although illustration is omitted, by adopting the structure shown in FIG. 5, the signal Q factor (quality factor) in the optical measurement becomes 460 from 320, approximately further 1.4 times. That is, it may be said that the voltage measurement precision can be further improved.

In this way according to the voltage sensor 1 of the present embodiment, because the fixed electrodes 30 are provided against the circular or roughly circular oscillator 20, and at positions different from the fixed electrodes 30, the drive electrodes 40 to which AC drive voltages are applied are included, the circular or roughly circular oscillator 20 oscillates to be crushed or pushed out by the drive electrodes 40, and the amplitude can be lowered as compared to the equally-advancing oscillator. Thus, the influence of gas damping can be reduced, and the oscillator 20 works stably, a noise is controlled and the signal factor (optical measurement) at the time of the resonance and the signal change (electrical measurement) can be raised. Because the parts such as the Pockels element, the quarter wave plate, the polarizer, the analyzer and the like are not necessary, and the alignment of the optical axis is not necessary either, the increase of the part number and complicatedness of the assembling can be prevented. Therefore, while the increase of the part number and the complicatedness of the assembling are prevented, the signal Q factor obtained by the optical measurement and the signal change obtained by the electrical measurement are raised and the voltage measurement precision can be improved.

Because the support member 10 is connected to at least one of the four knobs QP where the oscillating amplitude is minimized among the oscillator 20, an energy loss of the oscillation can be lower than a case of connecting to other points.

Because the fixed electrodes 30 are formed with the comb-like grooves 32 along the oscillation direction of the oscillator 20, gas escapes in parallel with the vibration, and the influence of gas damping can be controlled further.

Because the substrate B is provided with the opening B1 in a top view in the area where the oscillator 20, the fixed electrodes 30 and the drive electrodes 40 are formed, gas may escape at the time of oscillation from the opening B1 of the substrate B, and the influence of gas damping can be controlled further.

Because the two drive electrodes 40 are placed at the positions opposite to each other relative to the center of the oscillator 20, and AC voltages of the same phase are applied, the circular or roughly circular oscillator 20 can oscillate efficiently to be crushed or pushed out. Furthermore, because the two fixed electrodes 30 are placed at the positions perpendicular to the direction linking the two drive electrodes 40, by placing the two fixed electrodes 30 to face parts of the oscillator 20 where oscillation amount is the biggest, when the voltage to be measured is applied to the two fixed electrodes 30, the change of the resonance frequency of the oscillator 20 can be more remarkable, and the measurement accuracy can be improved.

Although the present invention has been described based on the embodiment, the present invention is not limited to the above embodiment, and modifications may be made without departing from the scope and spirit of the invention.

For example, in the present embodiment, the oscillator 20 and the drive electrodes 40 include the comb parts 22, 41, but the present invention is not limited to this, and as long as it is possible that an enough electrostatic attractive force is produced to make the oscillator 20 oscillate, the comb parts 22, 41 may not be included particularly.

As shown in FIG. 8, the substrate 13 may include a stopper part S1 to control excessive oscillation of the comb parts 22 from the back side (the ring member 21 side) of the comb parts 22, and a stopper part S2 to control excessive oscillation of the ring member 21 from the outside of the ring member 21. It is preferable for the stopper parts S1, S2 to be formed of floating electrodes, but the present invention is not limited to these floating electrodes particularly.

In addition, in the above embodiment, the two drive electrodes 40 are placed respectively at positions perpendicular to the direction linking the two fixed electrodes 30, but the present invention is not limited to this right angle, and the two drive electrodes 40 may be placed at slightly inclined positions. In this case, it is preferable to place so that the two fixed electrodes 30 and the knobs QP of the ring member 21 are not opposed to each other.

Furthermore, in the above embodiment, the fixed electrodes 30 are two ones, but the number is not particularly limited to two. Furthermore, the prevent invention is not limited to that the fixed electrodes 30 are provided at the outer side of the circular or roughly circular oscillator 20, and the fixed electrodes 30 may be provided at the inner side of the oscillator 20.

Furthermore, it is described in the above embodiment that the drive electrodes 40 are two ones, but only one drive electrode 40 may be provided, or four drive electrodes 40 may be provided around the oscillator 20 to have an angular difference of 90 degree to the adjacent ones. That is, the number of the drive electrodes 40 is not limited to two.

In addition, in the above embodiment, in view of act that the two drive electrodes 40 are provided at positions facing each other across the oscillator 20, AC voltages of the same phase are applied, but the present invention is not limited to this. For example, when the two drive electrodes 40 are placed to have an angular difference of 90 degree around the oscillator 20, AC voltages having opposite phases may be applied. Thereby, this also makes it possible to realize the vibration in a wineglass mode in which the vibrator 20 of a circular shape or the like is crushed or pushed out. The two driving electrodes 40 are not limited to have the angular difference of 90 degree, and if the phase of the AC voltage is appropriately adjusted according to the placement angle, it is possible to realize the vibration in a wineglass mode in which the vibrator 20 of a circular shape or the like is crushed or pushed out.

Two or more driving electrodes 40 are not necessary for the vibration in a wineglass mode in which the vibrator 20 of a circular shape or the like is crushed or pushed out. For example, it is possible to have one driving electrode 40 and four supporting means. In this case, the four support member are disposed every 90 degree, and if one electrostatic attractive force is applied to the one drive electrode 40 around the middle point of a portion supported by any two adjacent support member, vibration in the wine glass mode becomes possible.

What is claimed is:

1. A voltage sensor, comprising:
   a substrate,
   an oscillator that has a circular or roughly circular shape and is supported by a mechanical support member on the substrate,
   a fixed electrode that has a predetermined gap between the oscillator and the fixed electrode, and
   a drive electrode that is placed at a position different from the fixed electrode across the oscillator, and to which an AC drive voltage is applied to make the oscillator oscillate,
   wherein an electrostatic attractive force acts on the oscillator by applying a voltage to the fixed electrode, and a resonance frequency of the oscillator changes,
   wherein the fixed electrode is formed with comb-like grooves along the oscillation direction of the oscillator,
   wherein the mechanical support member supports the oscillator such that, when the oscillator oscillates in response to the AC drive voltage, the oscillator expands toward and contracts away from the fixed electrode and the oscillator expands toward and contracts away from the drive electrode, and
   wherein the substrate is provided with an opening in an area where the oscillator is formed in a top view.

2. The voltage sensor according to claim 1, wherein the support member is connected to at least one of four knobs where an oscillating amplitude is minimized among the oscillator.

3. The voltage sensor according to claim 1, wherein the fixed electrode and the drive electrode are formed on the substrate and the oscillator is disposed immediately above the substrate.

4. The voltage sensor according to claim 1, wherein the fixed electrode includes a first fixed electrode and a second fixed electrode,
the drive electrode includes a first drive electrode and a second drive electrode,
the first and second driving electrodes are disposed at positions opposite to each other relative to the center of the oscillator,
AC voltages with the same phase are applied to the first and second drive electrodes, and
a virtual line passing through the first and second fixed electrode is perpendicular to a virtual line passing through the first and second drive electrodes.

5. The voltage sensor of claim 1, wherein the fixed electrode has an arc shape to match an external shape of the oscillator, and has an arc inner portion which is placed to face the oscillator with the predetermined gap.

6. The voltage sensor of claim 5, wherein the fixed electrode is formed with the comb-like grooves at the arc inner portions along the oscillation direction of the oscillator.

7. The voltage sensor of claim 1, wherein the mechanical support member supports the oscillator such that the oscillator contracts away from the drive electrode when the oscillator expands toward the fixed electrode, and the oscillator expands toward the drive electrode when the oscillator contracts away from the fixed electrode.

8. A voltage sensor comprising:
a substrate,
an oscillator that has a circular or roughly circular shape and is supported by a mechanical support member on the substrate,
a fixed electrode that has a predetermined gap between the oscillator and the fixed electrode, and
a drive electrode that is placed at a position different from the fixed electrode across the oscillator, and to which an AC drive voltage is applied to make the oscillator oscillate,
wherein an electrostatic attractive force acts on the oscillator by applying a voltage to the fixed electrode, and a resonance frequency of the oscillator changes,
wherein the fixed electrode is formed with comb-like grooves along the oscillation direction of the oscillator,
wherein the mechanical support member supports the oscillator such that, when the oscillator oscillates in response to the AC drive voltage, the oscillator expands toward and contracts away from the fixed electrode and the oscillator expands toward and contracts away from the drive electrode, and
wherein a part of the substrate is a circular structure disposed at an inner side of the oscillator, and the circular structure is formed with comb-like grooves which extend along the oscillation direction of the oscillator.

* * * * *